(12) United States Patent
Tamaki (10) Patent No.: US 6,333,517 B1
(45) Date of Patent: Dec. 25, 2001

(54) SEMICONDUCTOR INTEGRATED CIRCUIT DEVICE EQUIPPED WITH POWER MAKE-UP CIRCUIT USED IN BURN-IN TEST AFTER PACKAGING AND METHOD FOR TESTING THE SAME

(75) Inventor: Satoshi Tamaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/480,489

(22) Filed: Jan. 11, 2000

(30) Foreign Application Priority Data

Jan. 12, 1999 (JP) .................................................. 11-005397

(51) Int. Cl.[7] ............................ H01L 23/58; H01L 29/76; H01L 29/94; H01L 31/062; H01L 31/113
(52) U.S. Cl. ............................ 257/48; 257/368; 257/379; 257/390
(58) Field of Search ............................ 257/48, 368, 379, 257/390, 392

(56) References Cited

U.S. PATENT DOCUMENTS

| | | | |
|---|---|---|---|
| 5,859,442 | * | 1/1999 | Manning ................................. 257/48 |
| 6,078,058 | * | 6/2000 | Hsu ......................................... 257/48 |

FOREIGN PATENT DOCUMENTS

| | | |
|---|---|---|
| S64-55857 | 3/1989 | (JP) . |
| 8-153390 | 6/1996 | (JP) . |
| 9-7400 | 1/1997 | (JP) . |
| H9-320296 | 12/1997 | (JP) . |
| 10-512081 | 11/1998 | (JP) . |

* cited by examiner

Primary Examiner—Ngân V. Ngô
(74) Attorney, Agent, or Firm—Sughrue Mion, PLLC

(57) ABSTRACT

There is a possibility that user brings a semiconductor dynamic random access memory device to a burn- in test after packaging, and a power transfer circuit is connected between an external pin and an internal power supply line, wherein the power transfer circuit discriminates an external high power voltage from other lower voltages so as connect the external pin to the internal power supply line, thereby allowing the user to carry out the burn-in test at a high speed.

18 Claims, 5 Drawing Sheets

SEMICONDUCTOR INTEGRATED CIRCUIT DEVICE EQUIPPED WITH POWER MAKE-UP CIRCUIT USED IN BURN-IN TEST AFTER PACKAGING AND METHOD FOR TESTING THE SAME

FIELD OF THE INVENTION

This invention relates to a semiconductor integrated circuit and, more particularly, to a semiconductor integrated circuit subjected to a test under application of a boosted voltage and a method for testing a semiconductor integrated circuit.

DESCRIPTION OF THE RELATED ART

The semiconductor memory device such as a dynamic random access memory device has been enhanced in data storage capacity. This means that the manufacturer has increased the memory cells and the control lines associated with the memory cells. The manufacturer brings products of the semiconductor memory device to various tests before delivery to customers in order to guarantee the products. The manufacturer eliminates defective products from the products through the various tests, and can deliver nondefective products to the customers. Thus, the tests are important. However, the tests consume time and labor due to the large number of components to be tested. It is necessary for the manufacturer to simplify a testing method and accelerate the tests.

Figure 1:
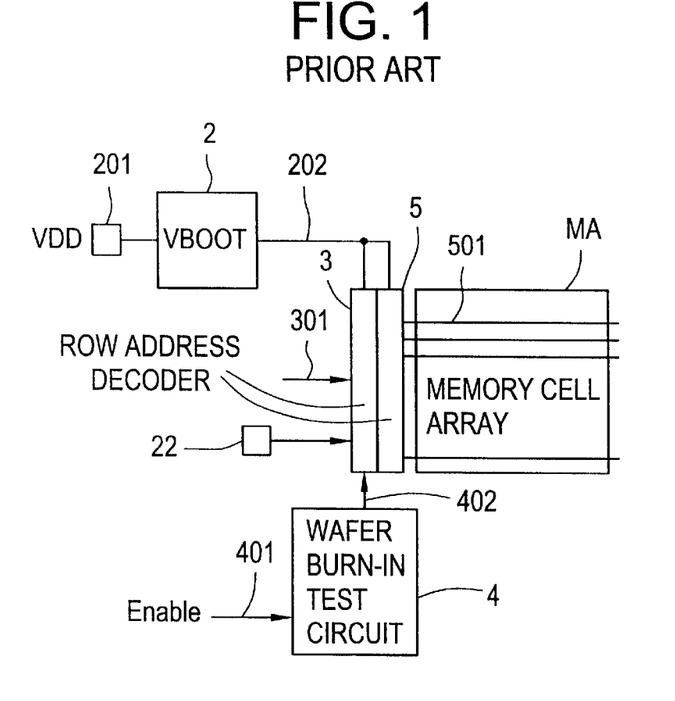
FIG. 1 is a block diagram showing the arrangement of the components incorporated in the prior art semiconductor dynamic random access memory device.

FIG. 1 shows a typical example of the semiconductor dynamic random access memory device with a built-in tester. Dynamic random access memory cells form a memory cell array MA, and word lines 501 are selectively connected to the dynamic random access memory cells. An external power voltage is applied to a power pin 201, and is supplied from the power pin 201 to a step-up circuit 2. The step-up circuit 2 is labeled with "VBOOT", and boot-straps the external power voltage. Thus, the step-up circuit 2 generates an internal power voltage higher in magnitude than the external power voltage, and supplies the internal power voltage through a power supply line 202 to a row address decoder 3 and a word line driver 5. Thus, the row address decoder 3 and the word line driver 5 are powered with the internal power voltage.

A row address predecoded signal 301 is supplied to the row address decoder 3, and the row address decoder 3 supplies row address decoded signals to the word line driver 5. The word line driver 5 selectively changes the word lines 501 assigned a row address identical with the row address represented by the row address decoded signals to the internal power voltage level. For this reason, the step-up circuit 2 is designed to have a bootstrap capability, which satisfies the current driving capability of the word line driver 5 to push up the selected single word line 501 to the internal power voltage level. When the manufacturer brings products of the prior art semiconductor dynamic random access memory device to a test on the word lines 501, the word line driver 5 sequentially changes the word lines 501 to the internal power voltage, and the test requires a long time.

In order to shorten the time period consumed in the tests, the manufacturer carries out a burn-in test before separating a semiconductor wafer into chips, and a wafer burn-in test circuit 4 is incorporated in the prior art semiconductor dynamic random access memory device. The wafer burn-in test circuit 4 is enabled with an external enable signal 401. Then, the wafer burn-in test circuit 4 supplies a control signal 402 to the row address decoder 3. The row address decoder 3 is responsive to the control signal 402 so as to change all the decoded address signals to the active level. This results in that the word line driver 5 make all the word lines 501 concurrently go up to the internal power voltage. Thus, all of the word lines 501 are concurrently changed to the internal power voltage level, and the burn-in test is accelerated.

Figure 2:
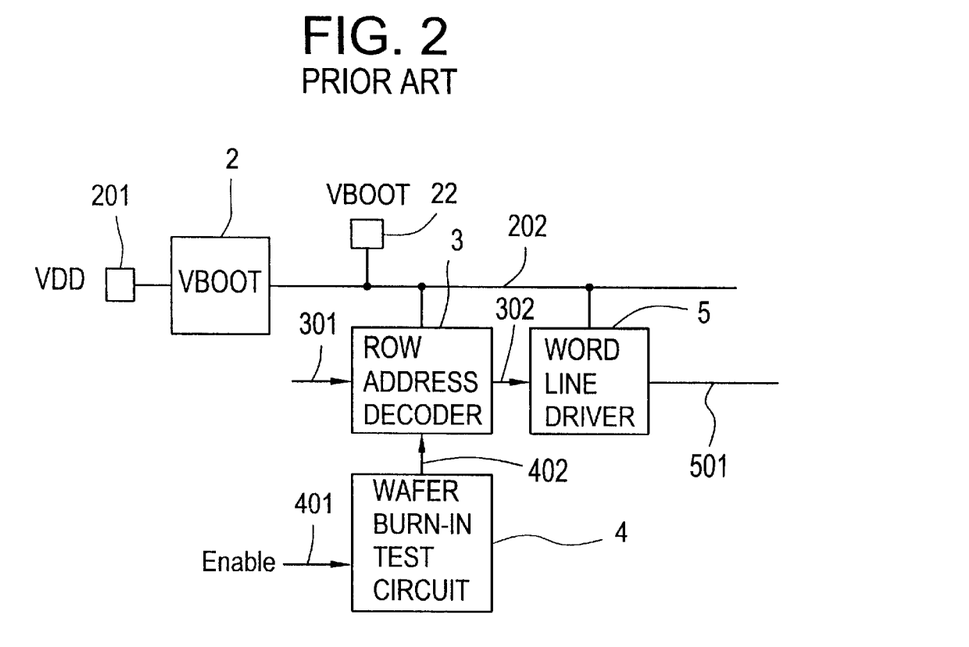
FIG. 2 is a block diagram showing the power supply pin connected to the power supply line for making up the boosted power voltage in the burn-in test.

The word line driver 5 consumes a large amount of electric current in the concurrent activation of all the word lines 501. However, the step-up circuit 2 has the small bootstrap capability as described hereinbefore. In other words, the bootstrap capability is too short to concurrently push up all the word lines 501 to the internal power voltage. For this reason, an additional power supply pin 22 is added to the prior art semiconductor dynamic random access memory device (see FIG. 2), and an external power source (not shown) makes up a boosted voltage VBOOT as high as the internal power voltage through the power supply pin 22 to the power supply line 202 during the burn-in test. The additional power supply pin 22 is useless after the burn-in test. For this reason, the manufacturer covers the additional power supply pin 22 with synthetic resin in the molding stage so as not to project from the plastic package.

Recently, there is a request to carry out the burn-in test similar to that described hereinbefore after the molding stage. However, the additional power supply pin 22 has been already covered with the synthetic resin, and is not available for the burn-in test after the molding stage.

Following, prior art documents have been found. The first prior art document is Japanese Patent Publication of Unexamined Application (laid-open) No. 9-7400, which was published on Jan. 10, 1997. A semiconductor memory device and a method for testing it are disclosed in Japanese Patent Publication of Unexamined Application No. 9-7400. Plural word lines and plural bit lines are concurrently selected from a set of word lines and a set of bit lines, and a test pattern is written into the memory cells connected to the selected word lines and the selected bit lines at a high speed. However, Japanese Patent Publication of Unexamined Application is silent to the burn-in test where all the word lines are concurrently activated.

Another prior art document is Japanese Patent Publication of Unexamined Application (laid-open) No. 8-153390, which was published on Jun. 11, 1996. The prior art document may less relate to the present invention. The prior art semiconductor integrated circuit disclosed therein has an output inverter. The prior art semiconductor integrated circuit is powered with a standard power voltage or a high power voltage. When the standard power voltage is selected, a boosted voltage is supplied from a boosting, circuit to the output inverter. When the high power voltage is selected, the boosting circuit is disabled so as to prevent the output inverter from damage due to an extremely high power voltage produced through the boosting operation on the high power voltage. Thus, the teachings of Japanese Patent Publication of Unexamined Application 8-153390 does not relate to the word lines of a semiconductor dynamic random access memory device, nor to the burn-in test.

Yet another prior art document is PCT Application laid-open No. 10-512081, the International Publication Number of which was WO 96/13037. A smart power source for a flash memory is disclosed in PCT Application laid-open No. 10-512081. An external power voltage is supplied to an external power supply pin, and an internal boosting circuit is incorporated in the smart power source. A detector monitors the external power voltage. If the standard power voltage is supplied to the external power supply pin, the detector instructs the boosting, circuit to distribute the boosted power voltage to other component circuits. However, if a high power voltage is supplied to the external power supply pin, the detector allows the high power voltage to be distributed to the other components. Thus, the teachings of PCT Application laid-open No. 10-512081 do not relate to the activation of word lines, nor the burn-in test.

SUMMARY OF THE INVENTION

It is therefore an important object of the present invention to provide a semiconductor integrated circuit device, which is brought to a test after a packaging with an external high power voltage.

It is also an important object of the present invention to provide a method for testing the semiconductor integrated circuit device.

To accomplish the object, the present invention proposes to provide a power transfer circuit in a semiconductor integrated circuit device for transferring the external high power voltage to an internal power supply line during a test after the packaging.

In accordance with one aspect of the present invention, there is provided a semiconductor integrated circuit device comprising a first external pin applicable with an external standard power voltage when the semiconductor integrated circuit device forms a part of an electric system, a first step-up circuit connected to the first external pin and produces a first internal high power voltage from the external standard power voltage, internal circuits connected through an internal power supply line to the first step-up circuit so as to be powered with the first internal high power voltage, a second external pin applicable with an external high power voltage higher than the external standard power voltage in a test carried out after completion of a fabrication of the semiconductor integrated circuit device and a power transfer circuit connected between the second external pin and the internal power supply line and discriminating a request for the test so as to connect the second external pin to the internal power supply line in the test.

In accordance with another aspect of the present invention, there is provided a method for testing a semiconductor integrated circuit device comprising the steps of applying an external high power voltage higher than an external standard voltage to an external pin, recognizing that a test is requested, transferring the external high power voltage through an internal power supply line to internal circuits and carrying a test under application of the external high power voltage to the internal circuits.

BRIEF DESCRIPTION OF THE DRAWINGS

The features and advantages of the semiconductor integrated circuit device and the method will be more clearly understood from the following description taken in conjunction with the accompanying drawings in which.

DESCRIPTION OF THE PREFERRED EMBODIMENTS

First Embodiment

Figure 3:
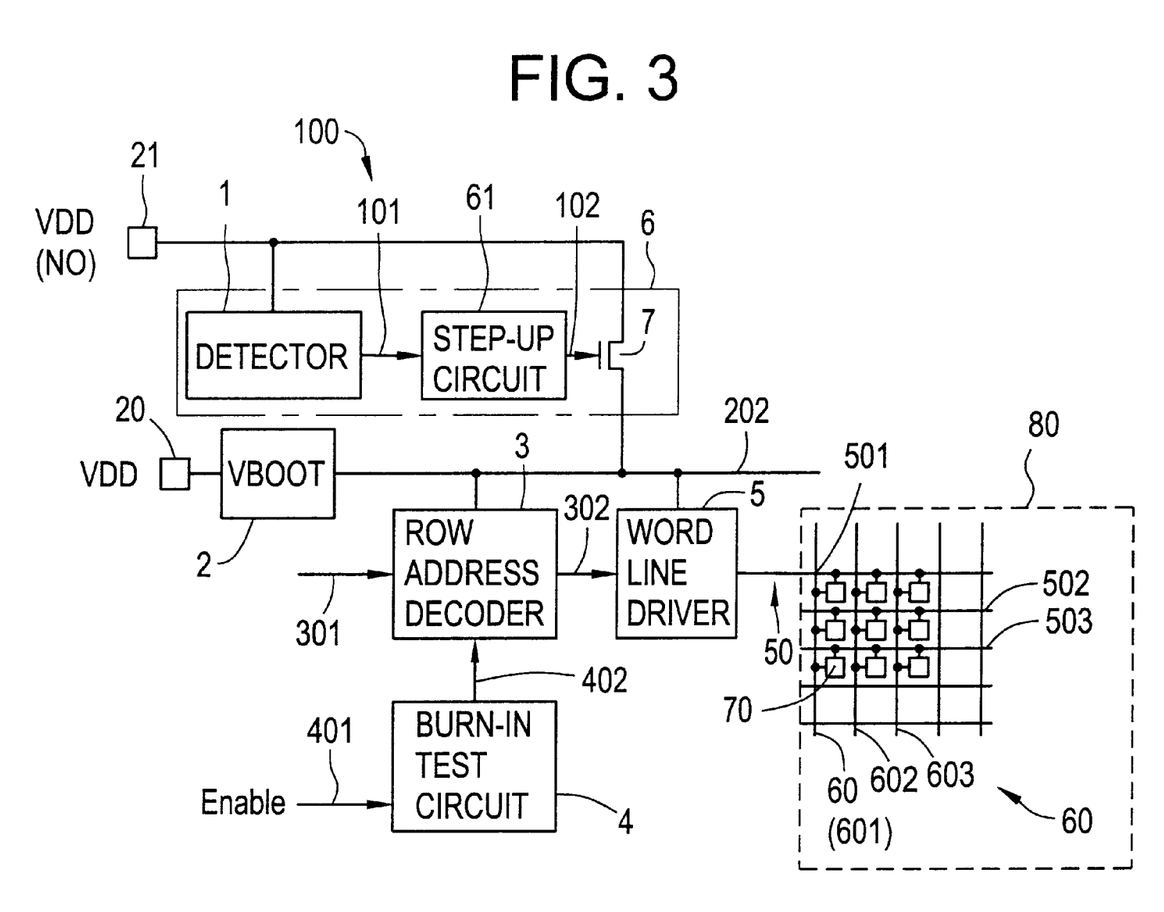
FIG. 3 is a block diagram showing an arrangement of essential components of a semiconductor dynamic random access memory device according to the present invention.

Referring to FIG. 3 of the drawings, a semiconductor dynamic random access memory device embodying the present invention is generally indicated at 100. The semiconductor dynamic random access memory device 100 comprises a data storage unit 80, which includes a set 50 of word lines 501, 502, 503 . . . , a set 60 of bit lines 601, 602, 603, . . . and dynamic random access memory cells 70 selectively connected to the word lines 501, 502, 503, . . . and the bit lines 601, 602, 603, . . . Row addresses arc assigned to the word lines 501, 502, 503, . . . , respectively, and column addresses arc assigned to the bit lines 601, 602, 603, . . . , respectively. The dynamic random access memory cells 70 are addressable by using a row address and a column address.

The semiconductor dynamic random access memory device further comprises a step-up circuit 2, a row address decoder 3, a burn-in test circuit 4 and a word line driver 5. A power supply pin 20 is connected to the step-up circuit 2, and an external power voltage VDD is supplied through the power supply pin 20 to the step-up circuit 2. In this instance, the external power voltage VDD is 3 volts. The step-up circuit 2 bootstraps the external power voltage VDD, and produces a boosted power voltage VBBOT from the external power voltage VDD. The step-up circuit 2 distributes the boosted voltage VBOOT through a power supply line 202 to the row address decoder 3 and the word line driver 5. The current driving capability of the step-up circuit 2 is not large. However, the step-up circuit 2 can permit the word line driver 5 to quickly change a word line 501/502/503/ . . . to the boosted voltage level VBOOT. For this reason, the step-up circuit 2 occupies a narrow area on a semiconductor chip, and the manufacturer does not need to use a large semiconductor chip for the semiconductor dynamic random access memory device.

Assuming now that the semiconductor dynamic random access memory device is installed in an electronic system as a data storage, row address predecoded signals 301 arc supplied to the row address decoder 3, and the row address decoder 3 changes one of the row address decoded signals 302 to an active boosted voltage level VBOOT on the basis of the row address predecoded signals 301. The word line driver S is responsive to the row address decoded signals 302 so as to selectively push up the word lines 501/502/503/ . . . to the boosted voltage level VBOOT. Then, data hits are read out from a row of dynamic random access memory cells 70 connected to the selected word line to the associated bit lines 601/602/603/ . . . , respectively. Although the read-out data bits are selectively transferred to an input/output data buffer, those circuits are deleted from FIG. 3 for the sake of simplicity. The burn-in test circuit 4 is disabled, and the control signal 402 is fixed to the inactive level.

The burn-in test circuit 4 is enabled with an enable signal 401 in a burn-in test, and changes a control signal 402 to an active level. The burn-in test circuit 4 supplies the control signal 402 to the row address decoder 3. When the control signal 402 is in the active level, the row address decoder 3 changes all the row address decoded signals 302 to the active boosted voltage level VBOOT, and makes the word line driver 5 to push up all the word lines 501/502/503/ . . . to the boosted voltage level VBOOT. Thus, all the word lines or the set 50 of word lines 501/502/503/ . . . are concurrently changed to the boosted voltage level VBOOT in the burn-in test.

The semiconductor dynamic random access memory device further comprises an external pin 21 and a power transferring circuit 6. While the semiconductor dynamic random access memory device is serving as a data storage in an electronic system, the external power voltage VDD is supplied to the external pin 21. However, when the manufacturer carries out a test such as, for example, a burn-in test for the set 50 of word lines 501/502/503/ . . . , an external high power voltage is applied to the external pin 21. The external high power voltage is higher than the external power voltage VDD, and is approximately equal to or higher than the boosted voltage VBOOT. In this instance, the external high power voltage is 5 volts. When the power transferring circuit 6 detects the external high power voltage, the power transferring circuit 6 connects the external pin 21 to the internal power supply line 202, and an external power source (not shown) supplies the external high power voltage through the external pin 21 to the internal power supply line 202. The current driving capability of the external power source is large enough to concurrently push up all the word lines 501/502/503/ . . . to the external high power voltage.

User is informed of the usage of the external pin 21. Namely, when the semiconductor dynamic random access memory device is connected to a board forming a part of an electronic system, the external pin 21 is connected to an external power supply line. The user is further informed that he can supply the external high voltage through the external pin 21 to the internal power supply line 202 if he wishes to check the word lines 501/502/503/ . . . through the burn-in test. For this reason, it is not necessary to bury the external pin 21 in the plastic package (not shown).

The power transferring circuit 6 includes a detector 1, a step-up circuit 61 and a switching element 7. In this instance, the switching element 7 is implemented by an n-channel enhancement type field effect transistor. The detector 1 is connected to the external pin 21, and checks the external pin 21 to see whether or not the external high power voltage is supplied thereto. If the external high power voltage is not supplied to the external pin 21, the detector 1 maintains a control signal 101 to an inactive level, and the step-up circuit 61 is not activated. The step-up circuit 61 maintains a gate control signal 102 in a low level, and the switching element 7 is turned off. The internal power supply line 202 is isolated from the external pin 21. When the external high power voltage is supplied to the external pin 21, the detector 1 changes the control signal 101 to an active level, and the step-up circuit 61 boosts the power voltage to a high level. The high level is higher than the external high power voltage by at least the threshold of the n-channel enhancement type field effect transistor, and the switching element 7 turns on. The switching, element 7 electrically connects the external pin 21 to the internal power supply line 202. Then, the external high power voltage is supplied through the internal power supply line 202 to the row address decoder 3 and the word line driver 5.

In this situation, the enable signal 401 is changed to the active level, and, accordingly, the burn-in test circuit 4 changes the control signal 402 to the active level. The row address decoder 3 changes all the row address decoded signals 302 to the active level, and the row address decoder signals 302 causes the word line driver 5 to change all the word lines 501/502/503/ . . . to the boosted voltage level VBOOT. All of the word lines 501/502/503/ . . . are quickly changed to the boosted voltage level, because the external power source (not shown) has the large current driving capability. The burn-in test is carried out under the application of the boosted voltage level VBOOT. The burn-in test is completed within a short time period.

Figure 4:
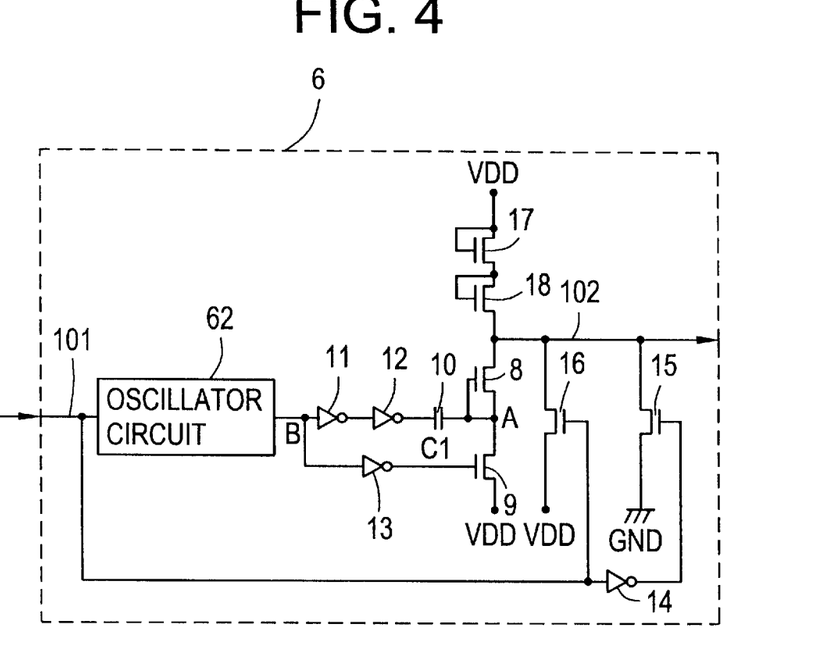
FIG. 4 is a circuit diagram showing the circuit configuration of a step-up circuit forming a part of a power transfer circuit.

FIG. 4 shows the circuit configuration of the step-up circuit 61 incorporated in the power transfer circuit 6. The step-up circuit 61 includes an oscillator circuit 62, a series of inverters 11/12, an inverter 13, a bootstrap capacitor 10, a series of n-channel enhancement type field effect transistors 8/9 and n-channel enhancement type field effect transistors 15/16. The oscillator circuit 62 is activated by the control signal 101 so as to output a periodic signal from the output node B to the inverters 11/13. The series of inverters 11/12 and the inverter 13 are connected in parallel to the output node B of the oscillator circuit 62. The series of inverters 11/12 produces an in-phase signal from the periodic signal, and the in-phase signal is supplied to one electrode of the bootstrap capacitor 10. On the other hand, the inverter 13 produces an anti-phase signal from the periodic signal.

The series of n-channel enhancement type field effect transistors 8/9 is connected between the gate control line 102 and a power supply line VDD. The node between the n-channel enhancement type field effect transistors 8/9 is labeled with "A". The power supply line VDD distributes a low power voltage equal to the external power voltage VDD to component circuits of the semiconductor dynamic random access memory device, and, for this reason, is labeled with "VDD". The other electrode of the bootstrap capacitor 10 is connected to the node A and the gate electrode of the n-channel enhancement type field effect transistor 8, and the inverter 13 supplies the anti-phase signal to the gate electrode of the n-channel enhancement type field effect transistor 9. While the periodic signal is maintained in the low level, the antiphase signal permits the n-channel enhancement type field effect transistor 9 to turn on, and the node A is charged to a positive voltage level lower than the internal low power voltage VDD by the threshold of the n-channel enhancement type field effect transistor 9. When the periodic signal is changed to the high level, the inverter 13 causes the n-channel enhancement type field effect transistor 9 to turn off with the anti-phase signal, and the inverter 12 supplies the in-phase signal to the bootstrap capacitor 10. Then, the potential level at the node A is bootstrapped over the internal low power voltage level VDD.

The n-channel enhancement type field effect transistor 16 is connected between the gate control line 102 and the internal low power supply line VDD, and is gated by the control signal line 101. On the other hand, the n-channel enhancement type field effect transistor 15 is connected between the gate control line 102 and the ground line GND, and a complementary control signal is supplied from the inverter 14 to the gate electrode of the n-channel enhancement type field effect transistor 15.

While the control signal line 101 is in the low level, the n-channel enhancement type field effect transistor 16 is turned off, and the gate control line 102 is electrically isolated from the internal low power voltage line VDD. However, the inverter 14 supplies a high level to the gate electrode of the n-channel enhancement type field effect transistor 15, and causes the n-channel enhancement type field effect transistor 15 to turn on. As a result, the gate control line 102 is fixed to the ground level. When the control signal line 101 is changed to the high level, the inverter 14 causes the n-channel enhancement type field effect transistor 15 to turn off. The gate control line 102 is isolated from the ground line. However, the high level on the control signal line 101 causes the n-channel enhancement type field effect transistor 16 to turn on, and the internal low power voltage line VDD charges the gate control line 102 to the positive voltage level (VDD−VT) lower than the internal low power voltage than the threshold of the n-channel enhancement type field effect transistor 16. As described hereinbefore, the bootstrap capacitor 10 boots the node A, and the potential level at the node A is transferred through the n-channel enhancement type field effect transistor 8 to the gate control line 102. The potential level on the gate control line 102 exceeds a certain level higher than the potential level on the control signal line 101 by the threshold, and makes the n-channel enhancement type field effect transistor 16 turn off.

Figure 5:
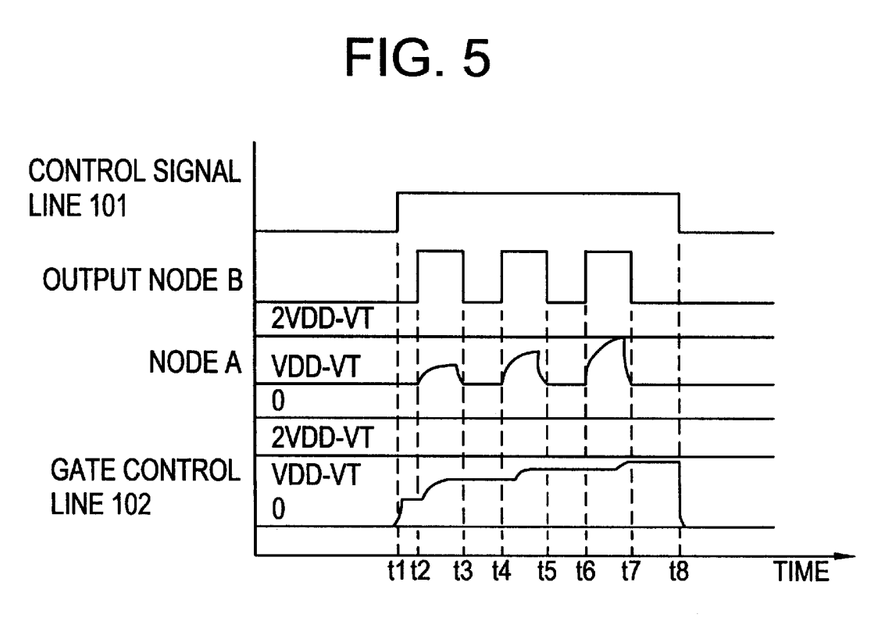
FIG. 5 is a timing chart showing, waveforms of essential signals and potential level on nodes in the step-up circuit.

FIG. 5 illustrates the bootstrap operation. The external power source is assumed to apply the external high power voltage to the external pin 21. The detector 1 discriminates the external high power voltage and changes the control signal line 101 to the active high level at time t1. Then, n-channel enhancement type field effect transistor 15 turns off. The n-channel enhancement type field effect transistor 16 turns on, and the control signal line 102 is charged to the positive voltage level (VDD−VT). The inverter 13 has caused the n-channel enhancement type field effect transistor 9 to charge the node A to the positive voltage level (VDD−VT).

The oscillator 62 is responsive to the active high level on the control signal line 101 so as to produce the periodic signal. The periodic signal rises at times t2, t4 and t6, and falls at times t3, t5 and t7. When the periodic signal once rises, the bootstrap capacitor C1 boosts the node A. The bootstrap capacitor has a capacitance C1, a parasitic capacitance coupled to the node A is C2, and the potential level at the node A is V2 before the n-channel enhancement type field effect transistor turns on. When the in-phase signal rises to the high level once, the bootstrap capacitor 10 boosts the node A by V2, and the V2 is given as

V2=((2VDD−VT)C1+C2V2)/(C1+C2)

The inverter 12 changes the in-phase signal to the ground level in response to the potential fall of the periodic signal, and the node A is decayed to the potential level (V2−VDD). The n-channel enhancement type field effect transistor 8 prevents the gate control signal line 102 from the potential fall at the node A. The n-channel enhancement type field effect transistor 9 turns on, and makes up the current to the node A. As a result, the node A is recovered to the potential level (VDD−VT). The node A finally reaches a positive high voltage level (2VDD−VT) between time t6 and time t7, and causes the gate control line 102 to rises to a positive high voltage level (2VDD−2VT). The positive potential level (2VDD−2VT) is higher than the external high power voltage by at least the threshold of the n-channel enhancement type field effect transistor 7. In other words, the positive potential level (2VDD−2VT) may be equal to or greater than (VBOOT+VT).

As will be understood from the forgoing description, the semiconductor dynamic random access memory device shown in FIG. 3 has the power transfer circuit 61, and the power transfer circuit 61 allows user to concurrently bring the set 50 of word lines 501/502/503/ . . . to the burn-in test after the packaging. While the semiconductor dynamic random access memory device is serving as a data storage of an electronic system, the power transfer circuit 61 prevents the internal power supply line 202 from undesirable discharge to the external pin 21, because the gate control signal line 102 forcibly keeps the n-channel enhancement type field effect transistor 7 off.

Second Embodiment

Figure 6:
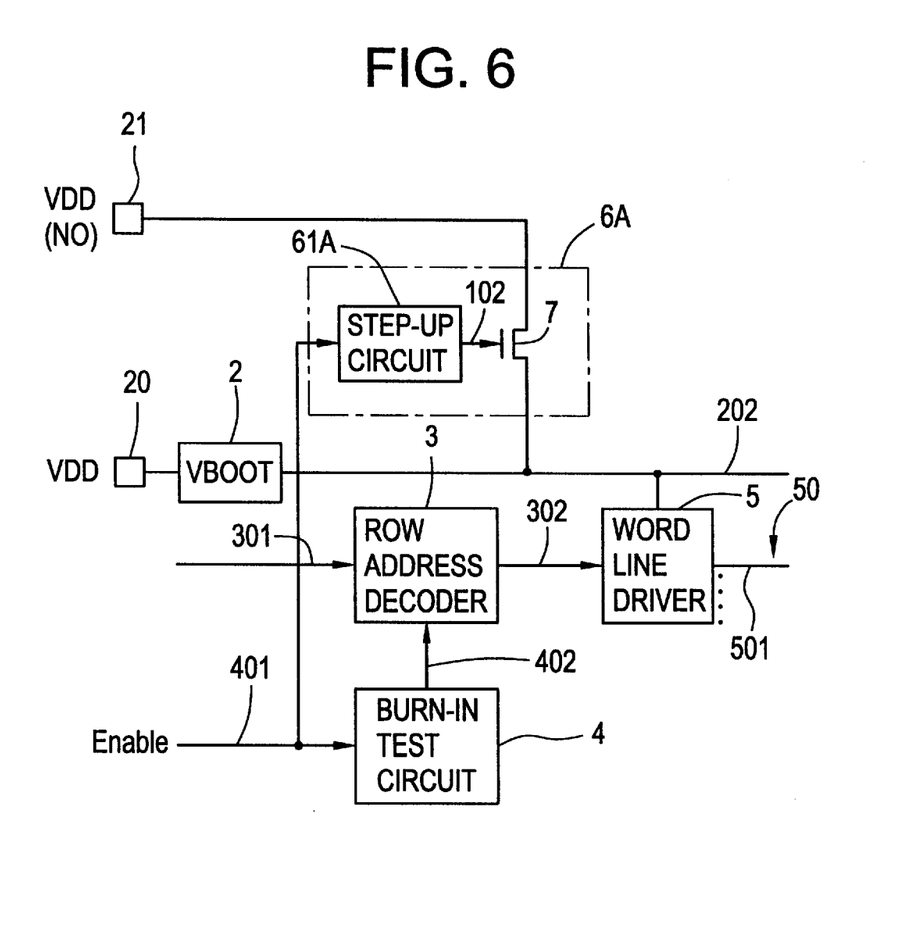
FIG. 6 is a block diagram showing an arrangement of essential components of another semiconductor dynamic random access memory device according to the present invention.

FIG. 6 shows another semiconductor dynamic random access memory device embodying the present invention. The semiconductor dynamic random access memory device implementing the second embodiment is similar to the first embodiment except a power transfer circuit 6A. For this reason, other components of the second embodiment are labeled with the same references designating corresponding components of the first embodiment without detailed description. Description is hereinbelow focused on the power transfer circuit 6A.

The power transfer circuit 6A includes a step-up circuit 61A and the switching unit 7. The switching unit 7 is implemented by an n-channel enhancement type field effect transistor. The step-up circuit 61A is responsive to the enable signal 401 so as to boost the gate control signal line 102 over the external high power voltage. Then, the switching element 7 turns on, and the external high power voltage is transferred to the internal power supply line 202. The step-up circuit 61A is similar in circuit configuration to the step-up circuit 61. For this reason, if the control signal line 101 is rewritten to "enable signal 401", the waveforms in FIG. 5 are applicable to the step-up circuit 61A.

The power transfer circuit 6A discriminates the external high power voltage, and makes up the current as similar to the power transfer circuit 6. For this reason, user can bring the set 50 of word lines to the burn-in test after the packaging. The power transfer circuit 6A is simpler than the power transfer circuit 6, and occupies an area narrower than the area occupied by the power transfer circuit 6.

Figure 7:
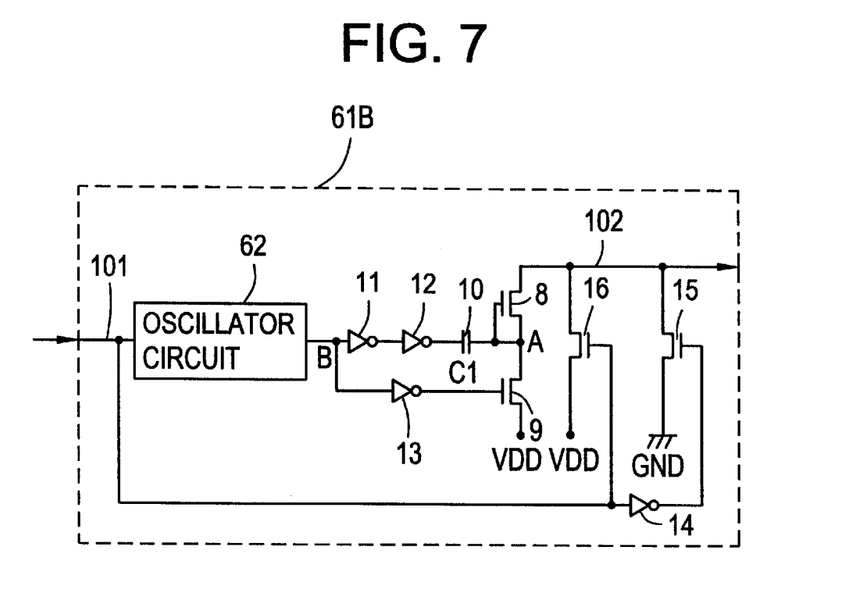
FIG. 7 is a circuit diagram showing the circuit configuration of a step-up circuit forming a part of a power transfer circuit available for the semiconductor dynamic random access memory devices shown in FIGS. 3 and 6.

FIG. 7 shows yet another step-up circuit 61B available for the semiconductor dynamic random access memory devices shown in FIGS. 3 and 6. The step-up circuit 61B is hereinbelow described on the assumption that the step-up circuit 61 is replaced with it. P-channel enhancement type field effect transistors 17/18 are connected between the low power supply line VDD and the gate control signal line 102, and have respective gate electrodes connected to the source nodes thereof. The series of p-channel enhancement type field effect transistors 17/18 does not allow the gate control signal line 102 to exceed a predetermined potential level (VDD+2VT). Other circuit components of the step-up circuit 61B are similar to those of the step-up circuit 61, and are labeled with the same references designating corresponding circuit components of the step-up circuit 61.

Figure 8:
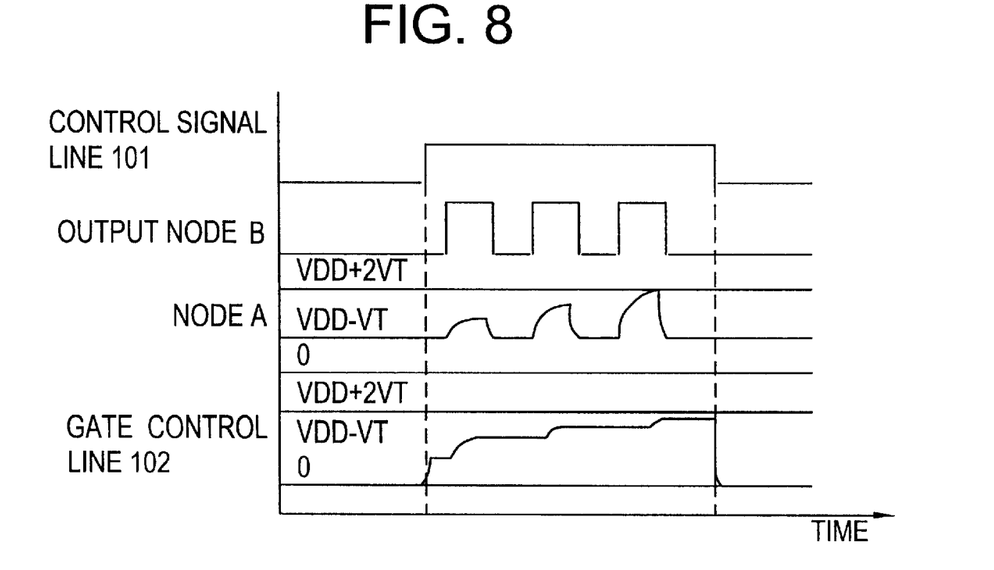
FIG. 8 is a timing chart showing waveforms of essential signals and potential level on nodes in the step-up circuit shown in FIG. 7.

The step-up circuit 61B behaves similar to the step-up circuit 61 as shown in FIG. 8. The potential level on the gate control signal line 102 is limited to the predetermined potential level (VDD+2VT). Thus, series of p-channel enhancement type field effect transistors 17/18 exactly sets the maximum potential on the gate control line 102 to the value (VDD+2VT). The maximum potential is variable together with the number of p-channel enhancement type field effect transistors.

Description is hereinbelow made on a test after the packaging. The test may be a kind of burn-in test. The external high power voltage is applied to the external pin 21. If the power transfer circuit 6 is incorporated in the semiconductor dynamic random access memory device, the detector 1 discriminates the external high power voltage, and instructs the step-up circuit 61/61B to boost the gate control signal line 102 over the external high power voltage. Then, the switching element 7 turns on, and the external high power voltage is transferred to the internal power supply line 202. Thus, the external high power voltage is transferred to the internal power supply line 202. Subsequently, the enable signal 401 is supplied from the outside to the burn-in test circuit 4, the burn-in test circuit 4 changes the control signal line 402 to the active level, and the row address decoder/word line driver 3/5 concurrently change all the word lines 501/502/503/ . . . to the external high power voltage. Thus, the burn-in test is carried out under the application of the external high power voltage, and checks the semiconductor dynamic random access memory device to see whether or not there is a defective element.

If the power transfer circuit 61A is incorporated in the semiconductor dynamic random access memory device, the test proceeds as follows. First, the external high power voltage is applied to the external pin 21. Subsequently, the enable signal is changed to the active level. Then, the power transfer circuit 6A transfers the external high power voltage to the internal power supply line 202, and the burn-in test circuit 402 changes the control signal 402 to the active level. The internal power supply line 202 supplies the external high power voltage to the row address decoder/word line driver 3/5, and all the word lines 501/502/503/ . . . are concurrently boosted to the external high power voltage. The burn-in test is carried out under the application of the external high power voltage, and checks the semiconductor dynamic random access memory device to see whether or not there is a defective element.

Although particular embodiments of the present invention have been shown and described, it will be apparent to those skilled in the art that various changes and modifications may be made without departing from the spirit and scope of the present invention.

The power transfer circuit 6 may be activated by the burn-in test circuit 4 enabled with the enable signal 401 so as to connect the external pin 21 to the internal power supply line 201.

The external high voltage may be supplied to an external pin, which is not to be connected to any signal line. The external pin is usually called as "NC (No Connection) pin".

The present invention is applicable to any kind of semiconductor integrated circuit in so far as an internal step-up circuit is incorporated therein and user wishes to bring it to a test after the packaging.

The burn-in test circuit may be responsive to an instruction signal so as to selectively bring the semiconductor integrated circuit into tests.

What is claimed is:

1. A semiconductor integrated circuit device comprising
    a first external pin applicable with an external standard power voltage when said semiconductor integrated circuit device forms a part of an electric system,
    a first step-up circuit connected to said first external pin and produces a first internal high power voltage from said external standard power voltage,
    internal circuits connected through an internal power supply line to said first step-up circuit so as to be powered with said first internal high power voltage,
    a second external pin applicable with an external high power voltage higher than said external standard power voltage in a test carried out after completion of a fabrication of said semiconductor integrated circuit device, and
    a power transfer circuit connected between said second external pin and said internal power supply line and discriminating a request for said test so as to connect said second external pin to said internal power supply line in said test.

2. The semiconductor integrated circuit device as set forth in claim 1, in which said power transfer circuit includes a switching element connected between said second external pin and said internal power supply line and changed to an on-state when said test is requested, and said switching element is turned off while said semiconductor integrated circuit device is serving as said part of said electric system.

3. The semiconductor integrated circuit device as set forth in 2, in which a transistor serves as said switching element.

4. The semiconductor integrated circuit device as set forth in claim 3, in which said power transfer circuit further includes
    a detector connected to said second external pin and checking said second external pin to see whether or not said external high power voltage is supplied to said second external pin for producing a first control signal representative of detection of said external high power voltage, and
    a controller connected between said detector and a control node of said transistor and responsive to said first control signal so as to supply a second control signal of an active level to said control node of said transistor for changing said transistor to an on-state.

5. The semiconductor integrated circuit device as set forth in claim 4, in which said transistor is an n-channel enhancement type field effect transistor, and said controller is a second step-up circuit for boosting said second control signal over said external high power voltage.

6. The semiconductor integrated circuit device as set forth in claim 3, in which said power transfer circuit further includes a controller responsive to an external control signal supplied thereto as well as one of said internal circuits serving as a test circuit so as to supply a second control signal of an active level to said control node of said transistor for changing said transistor to an on-state.

7. The semiconductor integrated circuit device as set forth in claim 6, in which said transistor is an n-channel enhancement type field effect transistor, and said controller is a second step-up circuit for boosting said second control signal over said external high power voltage.

8. The semiconductor integrated circuit device as set forth in claim 1, in which a test circuit, a row address decoder, a word line driver and a memory cell array serve as some of said internal circuits, said test circuit is responsive to an external control signal in said test for changing a first control signal to an active level, said row address decoder is responsive to an internal address signal to as to cause said word line driver to selectively change word lines of said memory cell array to an active level while said semiconductor integrated circuit is serving as said part of said electric system, and said row address decoder is responsive to said first control signal in said test so as to change plural word lines to said external high power voltage.

9. The semiconductor integrated circuit device as set forth in claim 8, in which said row address decoder and said word line driver are connected to said internal power supply line, said power transfer circuit includes a switching element connected between said second external pin and said internal power supply line changed to an on-state when said test is requested, and said switching element is turned off while said semiconductor integrated circuit device is serving as said part of said electric system.

10. The semiconductor integrated circuit device as set forth in 9, in which a transistor serves as said switching element.

11. The semiconductor integrated circuit device as set forth in claim 10, in which said power transfer circuit further includes

- a detector connected to said second external pin and checking said second external pin to see whether or not said external high power voltage is supplied to said second external pin for producing a first control signal representative of detection of said external high power voltage, and
- a controller connected between said detector and a control node of said transistor and responsive to said first control signal so as to supply a second control signal of an active level to said control node of said transistor for changing said transistor to an on-state.

12. The semiconductor integrated circuit device as set forth in claim 11, in which said transistor is an n-channel enhancement type field effect transistor, and said controller is a second step-up circuit for boosting said second control signal over said external high power voltage.

13. The semiconductor integrated circuit device as set forth in claim 12, in which said second step-up circuit has a bootstrap capacitor, an oscillator responsive to said first control signal for producing a periodic signal and switching circuit connected between said oscillator, said bootstrap capacitor and a signal line for propagating said second control signal to said control node of said n-channel enhancement type field effect transistor, and said switching circuit alternately supplies an in-phase signal of said periodic signal and an anti-phase signal of said periodic signal to electrodes of said boot-strap capacitor for boosting said second control signal over said external high power voltage.

14. The semiconductor integrated circuit device as set forth in claim 13, in which said second step-up circuit further has a voltage limiter connected to said signal line so as to set a limit on the potential level on said signal line.

15. The semiconductor integrated circuit device as set forth in claim 10, in which said power transfer circuit further includes a controller responsive to an external control signal supplied thereto as well as said test circuit so as to supply a second control signal of an active level to said control node of said transistor for changing said transistor to an on-state.

16. The semiconductor integrated circuit device as set forth in claim 15, in which said transistor is an n-channel enhancement type field effect transistor, and said controller is a second step-up circuit for boosting said second control signal over said external high power voltage.

17. The semiconductor integrated circuit device as set forth in claim 16, in which said second step-up circuit has a bootstrap capacitor, an oscillator responsive to said first control signal for producing, a periodic signal and switching circuit connected between said oscillator, said bootstrap capacitor and a signal line for propagating said second control signal to said control node of said n-channel enhancement type field effect transistor, and said switching circuit alternately supplies an in-phase signal of said periodic signal and an anti-phase signal of said periodic signal to electrodes of said boot-strap capacitor for boosting said second control signal over said external high power voltage.

18. The semiconductor integrated circuit device as set forth in claim 17, in which said second step-up circuit further has a voltage limiter connected to said signal line so as to set a limit on the potential level on said signal line.

* * * * *